PRINTED CIRCUIT BOARD

Filed March 25, 1963

INVENTOR.
CHARLES G. KALT

BY Mallinckrodt and Mallinckrodt
ATTORNEYS

United States Patent Office
3,205,298
Patented Sept. 7, 1965

3,205,298
PRINTED CIRCUIT BOARD
Charles G. Kalt, 24 Hoxsey St., Williamstown, Mass.
Filed Mar. 25, 1963, Ser. No. 267,676
7 Claims. (Cl. 174—68.5)

Figures 1, 2, 3, 4:
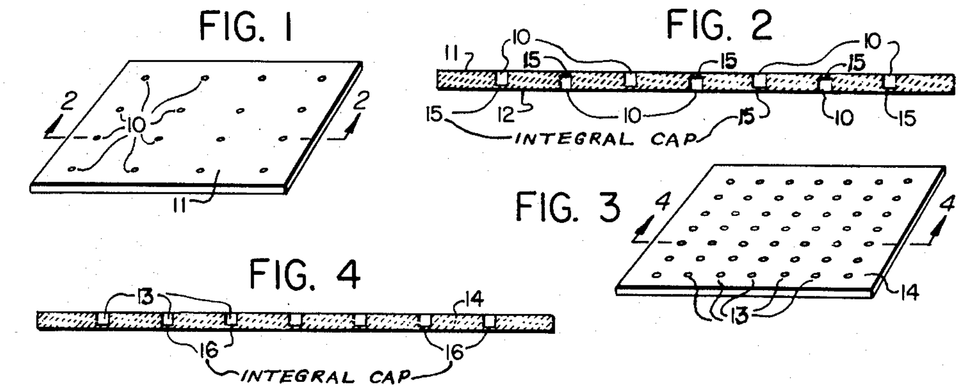

This invention relates to articles of manufacture known as terminal boards, which are extensively used for the mounting of electrical circuits of all kinds.

Terminal boards are made of dense and hard insulating material, usually a ceramic or a thermosetting plastic resin such as Bakelite or the newer glass-fiber-reinforced epoxy resins. They are of panel formation and are used for conventionally wired circuits, and for so-called "printed circuits" including circuits formed by depositing an electrically conductive material in circuit arrangement on a face of the board. Regardless of how used, they are ordinarily provided with a number of passages extending entirely through the board, from one broad panel face to the opposite broad panel face, in patterns conforming to predetermined circuit arrangements.

A very desirable material for terminal boards is a high alumina content (approximately 95% or higher) ceramic. This material has excellent electrical insulating properties and high structural strength over a wide temperature range. It is dimensionally stable under extremes of temperature, has low moisture absorbability, and excellent heat shock properties. However, it is extremely hard and brittle. After setting and curing it can be satisfactorily worked only slowly and expensively.

Working of a terminal board often becomes necessary in order to adapt it to a particular situation. For example, it is often necessary to drill additional holes through the material, either during original fabrication of a terminal board assembly or later in changing an existing installation.

The present invention is concerned with making the task of supplying additional holes a simple and inexpensive matter and with providing a stock terminal board which can be used for many applications by a minimum amount of quick and easy working, regardless of the hardness of the insulating material concerned.

A feature in the accomplishment of these purposes is the provision of a multiplicity of holes extending deeply into the material of the board, each hole originating in a broad panel face of the board and extending toward and almost to, but short of, the other broad panel face, leaving a relatively thin sheet of the insulating material closing the hole at such opposite panel face. Such a hole may be appropriately spoken of as a "capped hole."

In many instances, it will be best that all the holes originate in the same broad panel face of the board, leaving the opposite broad panel face smooth and unbroken for the reception of the electrical circuit, this being particularly true in instances of "printed" and deposited circuits. However, in some instances it may be preferable to arrange the holes so that some originate in one face of the board and others in the opposite face, either alternately or in some other symmetrical or unsymmetrical pattern.

Whatever the arrangement, it will be found that the provision of deep holes in the hard and brittle material, closed by a relatively thin sheet of such material at one end but open at the other, will enable through-passages for connective wiring or other circuit components to be quickly and easily attained by a simple punching operation or by an ordinary drilling operation.

Even though the final terminal board has a multiplicity of deep holes or recesses scattered throughout, which, having not been selected for punching or drilling, are useless to the particular electrical circuit concerned, such board is still completely acceptable for its appointed purpose, because the insulation is unbroken. The hole capping insures effective insulating and structural continuity throughout the expanse of the board. If used for "printed" circuitry, such a board may be dipped in customary manner to coat circuit holes which pass entirely through the board, without endangering the circuitry, and, whenever required, one broad panel face of any terminal board can be retained smooth and unbroken for favorable reception of "printed" or deposited circuit components. In many instances, at least some of the otherwise unused holes whose closed ends or caps remain intact will be found useful for accommodating certain circuit components, binding posts, terminals, etc.

Specific embodiments representing what are presently regarded as the best modes of carrying out the invention are illustrated in the accompanying drawings.

Figures 5, 6:
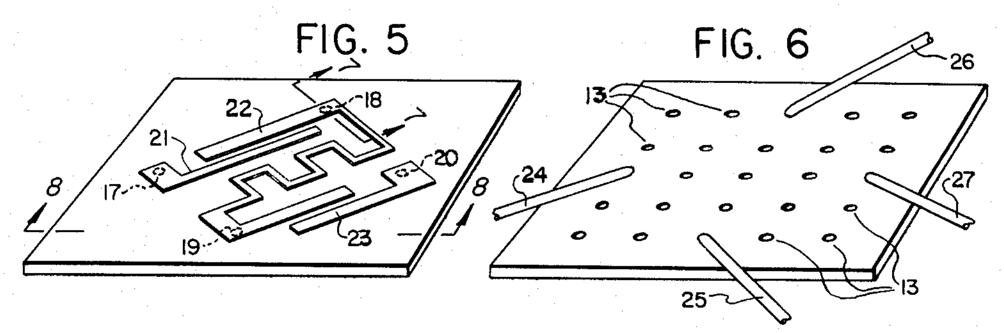
Figure 7:
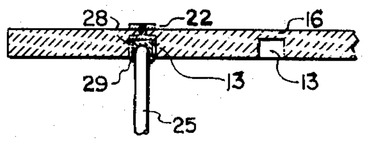
Figure 8:
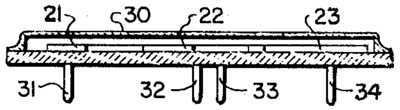
Figure 10:
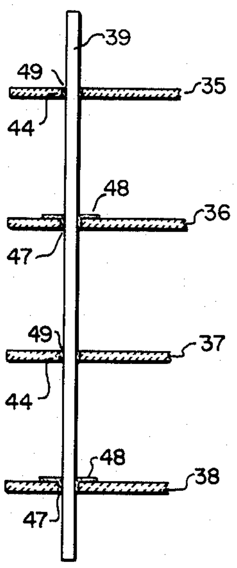
Figure 9:
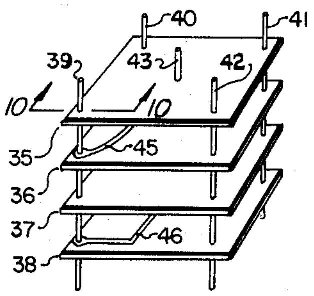

In the drawings:

FIG. 1 represents a view in perspective showing one broad panel face of one style of electric terminal board in accordance with the invention, the holes originating in both broad faces of the panel and alternating in arrangement;

FIG. 2, a vertical section taken on the line 2—2 of FIG. 1 but drawn to a larger scale;

FIG. 3, a view in perspective showing the perforate face of another style of electrical terminal board in accordance with the invention, wherein the holes all originate in a single broad face of the panel;

FIG. 4, a view similar to that of FIG. 2 but taken on the line 4—4 of FIG. 3;

FIG. 5, a view in perspective showing the imperforate face of an electric terminal board corresponding to that of FIG. 3 but bearing a simple "printed" circuit layout thereon and having the normally closed ends of certain appropriate holes opened and accommodating electrical connections directly through such terminal board from the back thereof;

FIG. 6, a view corresponding to that of FIG. 5, but in bottom perspective;

FIG. 7, a fragmentary vertical section taken on the line 7—7 of FIG. 5 and drawn to a considerably larger scale;

FIG. 8, a similar view taken on the line 8—8 of FIG. 5, but showing additional structure hermetically sealing the circuit as a header;

FIG. 9, a view in perspective of a stacked arrangement of electric terminal boards of the invention in the form of a micro miniature electronic module; and FIG. 10, a fragmentary vertical section taken on the line 10—10 of FIG. 9 and drawn to a considerably larger scale.

Referring to the drawings:

The various terminal boards of the several figures of the drawings can be made of any of the ceramic or plastic materials commonly employed for the purpose. One of the advantages of this invention, however, is that a high alumina ceramic, which is exceptionally hard and difficult to work when cured, yet has superior mechanical strength and electrical insulating capacity, may be conveniently used.

These terminal boards are of panel configuration and are made by molding the ceramic or plastic material to final form. The formed material is then cured to its final hard condition as a panel. The panels may be of widely differing sizes, shapes, and thicknesses, depending upon the requirements of the particular uses to which the terminal boards are put.

The particular style of terminal board shown by FIGS. 1 and 2 has half the total number of its holes 10 originating in one broad face 11 of the panel and the other half originating in the opposite broad face 12 in an alternating arrangement with the first half. The particular style shown in FIGS. 3 and 4 has all of its holes 13 originating in one broad face 14 of the panel.

The dimensions of the holes 10 and 13, their number, shape, and their arrangement can vary considerably in accordance with the particular uses. The important thing is that these holes be deep relative to the thickness of the panel, leaving relatively thin sheet portions 15 and 16, respectively, of the material at the opposite broad face of the panel from that in which they originate, as closed ends or capping for the holes. The depth of the holes will normally be of the same order of magnitude as the thickness of the panel, leaving the capping material very thin, e.g. from 1 to 10 mils in thickness.

The particular "printed" circuitry shown in FIG. 5 represents merely one specific instance of use of the terminal boards of the invention. There, a terminal board similar to that of FIGS. 3 and 4 has all its holes 13, FIGS. 6 and 7, originating in the lower face of the panel and terminating short of the upper face. Openings 17, 18, 19, and 20 at selected ones of the holes 13, respectively, were formed by drilling or punching through the material 16, FIG. 7, which caps such holes and provides structural and insulating continuity for the upper face of the panel. Printed circuit components 21, 22, and 23 of the thin film type were applied to such upper face of the panel in well known manner as a resistive capacitive network.

As shown in FIGS. 6 and 7 and as an important feature of the invention, electrical conductors 24, 25, 26, and 27 at the back of the board are electrically connected through the panel with the aforesaid circuit components by way of the respective openings 17, 18, 19, and 20 and their corresponding holes 13, which latter are advantageously metallized by the application of a gold-platinum frit 28 to provide good electrical connections. Solder 29 is used to secure the ends of the conductors in the holes 13, as shown.

Such precise connections of conductors to printed circuitry at substantially right-angles and in a manner which does not effectively interrupt surface continuity of a terminal board is believed to be novel in the art. Here, it should be realized that, while printed circuitry is shown on the upper surface of the panel, point contacts can just as easily be provided by the metallizing frit 28 extending through an opening 17, 18, 19, or 20. Thus, it can be seen that very precise connections can be easily made to delicate circuitry at one face of a terminal board, while requisite electrical connections of relative crudity are made at the opposite face of the board in conventional manner, as by use of a soldering iron.

In FIG. 8, the same terminal board is shown as a header, with a cover 30 hermetically sealed to the upper surface of the terminal board and with plug-in connectors 31, 32, 33, and 34 replacing the conductors 24, 25, 26, and 27. This shows that it is now economically feasible to combine plug-in components and printed circuits in an integrated unit.

With the terminal boards constructed as they are, utility through-passages or openings can be easily, inexpensively, and accurately provided almost anywhere required by the particular application concerned, making such panels highly useful and advantageous for all printed circuitry, integrated circuitry, and micro miniature electronic modules. Versatility of application is imparted to an inherently inflexible material, i.e. the high alumina ceramic previously mentioned, in that a large number of openings from one broad panel face to the opposite broad panel face are readily attained. This enables a number of such terminal boards to be conveniently structurally joined together in vertically spaced and stacked arrangement as a micro miniature electronic module and enables circuit components of the several structurally integrated terminal boards to be conveniently interconnected electrically.

Thus, as illustrated in FIGS. 9 and 10, four terminal boards 35, 36, 37, and 38 are structurally and electrically interconnected in a vertically stacked and mutually spaced arrangement by means of rods 39, 40, 41, 42, and 43 fitted into respective sets of registering through-passages, e.g. 44, FIG. 10, provided by drilling or otherwise forming openings through appropriate deep holes in such terminal boards Such openings may, as in the instance illustrated, be equal diameter continuations of the preformed deep holes provided in the terminal boards, or may be of lesser diameter, depending upon the circumstances. Also, the rods 39–43 may be of electrically conductive material, as is rod 39, so as to serve both structurally and as electrical conductors, or may be of insulating material to serve only structurally.

As shown in FIG. 10, the electrically conductive rod 39 is electrically connected to printed circuitry 45 and 46 on terminal boards 36 and 38, respectively, by means of respective coatings 47 of conductive material applied by dipping or in some other suitable manner to the annular hole-defining surfaces of the holes 44. Such coatings 47 are preferably integral with conductive land areas 48 of the respective circuitry 45 and 46.

The rod 39 is, in the particular instance shown, merely structurally secured to the terminal boards 35 and 37, as by means of a suitable glue or cement 49.

The particular embodiments shown are indicative of the flexibility of application and the versatility of the terminal boards of the invention.

Whereas these illustrated forms of electric terminal boards, and of structures utilizing same, are presently regarded as the best modes of carrying out the inventive concepts, it should be understood that various other forms are possible without departing from the invention as particularly pointed out in the following claims.

I claim:

1. An electric terminal board, comprising a panel of electrical insulating refractory material having a multiplicity of deep holes distributed throughout its length and breadth, each of said holes extending from one broad face of said panel toward but short of the opposite broad face thereof leaving a relatively thin integral cap of said material at said other face as a closed and insulating end for said hole, said opposite broad face carrying printed circuitry thereon, the said terminal board presenting an unbroken continuity of electrical insulating material throughout substantially its entire extent.

2. The electric terminal board of claim 1, wherein the material is a high alumina ceramic of extreme hardness.

3. The electric terminal board of claim 1, wherein all the holes have their openings at the same broad face of the panel and their closed ends at the opposite broad face of such panel.

4. The electric terminal board of claim 3, wherein certain of the holes have openings through their normally closed ends, and wherein electrical conductors extend through said certain holes from the specified same broad face of the panel and are electrically connected to components of said circuitry at substantially right angles thereto.

5. The electric terminal board of claim 4, wherein the specified openings are substantially point openings of considerably less area than the area of the closed ends through which they extend.

6. The electric terminal board of claim 5, wherein the electrical conductors are connector pins, and there is additionally provided a closed cover on the specified opposite broad face of the panel which is hermetically sealed to the panel and encloses said circuitry.

7. The electric terminal board of claim 1, wherein alternate holes have their openings at respectively opposite broad faces of the panel and their closed ends at respectively opposite broad faces of such panel.

References Cited by the Examiner

UNITED STATES PATENTS

| | | | |
|---|---|---|---|
| D. 171,301 | 1/54 | Kravitz | 15—215 X |
| 2,652,878 | 9/53 | Gerard | 161—131 X |
| 2,902,628 | 9/59 | Leno | 317—101 |
| 2,931,003 | 3/60 | Huetten et al. | 317—101 X |
| 2,971,138 | 2/61 | Meisel et al. | 317—101 |
| 3,019,283 | 1/62 | Little | 174—68.5 |
| 3,051,608 | 8/62 | Gordon | 161—131 X |
| 3,054,024 | 9/62 | Van Dillen et al. | 317—101 |
| 3,097,032 | 7/63 | Hochheiser | 317—101 X |

JOHN F. BURNS, *Primary Examiner.*

JOHN P. WILDMAN, *Examiner.*